United States Patent
Reig et al.

(10) Patent No.: US 10,644,067 B2
(45) Date of Patent: May 5, 2020

(54) RF/DC DECOUPLING SYSTEM FOR RF SWITCHES BASED ON PHASE CHANGE MATERIAL

(71) Applicant: COMMISSARIAT A L'ENERGIE ATOMIQUE ET AUX ENERGIES ALTERNATIVES, Paris (FR)

(72) Inventors: Bruno Reig, Moirans (FR); Alexandre Leon, Sassenage (FR); Damien Saint-Patrice, Chabeuil (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/131,220

(22) Filed: Sep. 14, 2018

(65) Prior Publication Data

US 2019/0088721 A1    Mar. 21, 2019

(30) Foreign Application Priority Data

Sep. 19, 2017    (FR) .................................... 17 58680

(51) Int. Cl.
- *H01L 27/24* (2006.01)
- *H01L 45/00* (2006.01)
- *H01P 1/10* (2006.01)

(52) U.S. Cl.
CPC ...... *H01L 27/2463* (2013.01); *H01L 27/2409* (2013.01); *H01L 45/06* (2013.01); *H01L 45/126* (2013.01); *H01L 45/1226* (2013.01); *H01P 1/10* (2013.01); *H01L 45/144* (2013.01)

(58) Field of Classification Search
CPC . H01L 27/2463; H01L 27/2409; H01L 45/06; H01L 45/126; H01L 45/1226; H01L 45/144; H01P 1/10
USPC ........... 257/3, 4, E21.24, E21.585, E45.002, 257/E47.001; 326/38; 333/262, 186; 438/637, 710
See application file for complete search history.

(56) References Cited

U.S. PATENT DOCUMENTS

| | | | | |
|---|---|---|---|---|
| 5,757,446 A | * | 5/1998 | Ovshinsky | C03C 3/321 349/49 |
| 8,178,380 B2 | * | 5/2012 | Kordus, II | H01L 45/06 257/2 |
| 9,362,492 B2 | * | 6/2016 | Goktepeli | H01L 45/1608 |
| 9,368,720 B1 | * | 6/2016 | Moon | H01L 45/1286 |
| 9,673,392 B2 | * | 6/2017 | Borodulin | H01L 45/126 |
| 2006/0102927 A1 | * | 5/2006 | Fujita | G11C 13/0004 257/130 |

(Continued)

OTHER PUBLICATIONS

French Preliminary Search Report dated Jul. 6, 2018 in French Application 17 58680 filed Sep. 19, 2017 (with English Translation of Categories of Cited Documents).

(Continued)

*Primary Examiner* — Dao H Nguyen
(74) *Attorney, Agent, or Firm* — Oblon, McClelland, Maier & Neustadt, L.L.P.

(57) ABSTRACT

An RF switch provided with a first region based on a phase change material disposed between a first conductive element and a second conductive element and state control means for said first region, the switch being further provided with at least one first decoupling switch provided with a second region of phase change material.

15 Claims, 10 Drawing Sheets

(56) References Cited

U.S. PATENT DOCUMENTS

| | | | |
|---|---|---|---|
| 2007/0096071 A1* | 5/2007 | Kordus, II | H01L 45/06 257/2 |
| 2008/0029753 A1* | 2/2008 | Xu | H01L 45/06 257/4 |
| 2008/0080109 A1* | 4/2008 | Duch | H02H 9/046 361/56 |
| 2014/0191181 A1* | 7/2014 | Moon | H01L 27/2409 257/4 |
| 2014/0266517 A1 | 9/2014 | Werner et al. | |
| 2016/0056373 A1 | 2/2016 | Goktepeli et al. | |
| 2018/0005786 A1* | 1/2018 | Navarro | H01H 37/34 |

OTHER PUBLICATIONS

U.S. Appl. No. 15/101,825, filed Jun. 3, 2016, US-2017-0057809-A1, Damien Saint-Patrice, et al.

U.S. Appl. No. 15/385,209, filed Dec. 20, 2016, US-2017-0183224-A1, Bruno Reig, et al.

U.S. Appl. No. 15/636,815, filed Jun. 29, 2017, US-2018-0005786-A1, Gabriele Navarro, et al.

\* cited by examiner

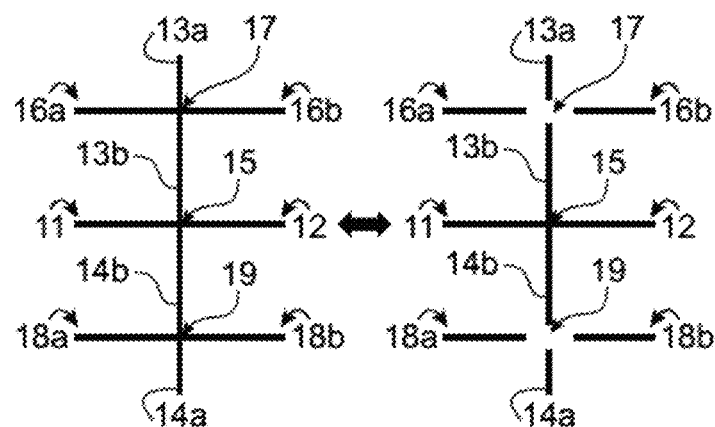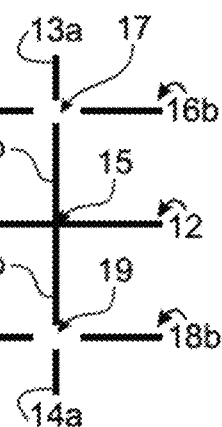
FIG.3A  FIG.3B
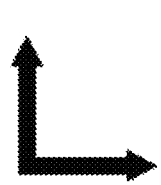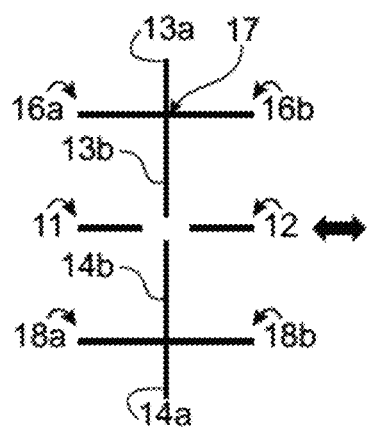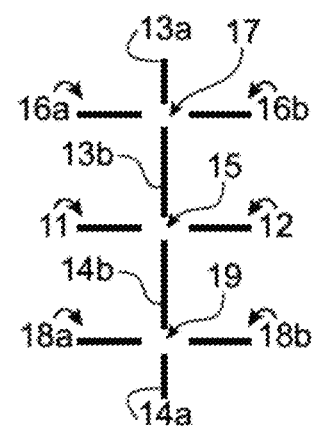
FIG.3C  FIG.3D

RF/DC DECOUPLING SYSTEM FOR RF SWITCHES BASED ON PHASE CHANGE MATERIAL

TECHNICAL FIELD AND PRIOR ART

The present application relates to the field of RF switches integrating a phase change material and more particularly is concerned with those made of thin films and which can be part of an integrated circuit or an electronic device.

An RF switch is a structure for modifying reversibly the electrical connections between elements of an RF circuit.

RF switches are usually made from electronic components such as field effect transistors or PIN ("Positive Intrinsic Negative") diodes or using MEMS type electromechanical relays.

RF switches integrating a phase change material (PCM) have also appeared.

The operation of an RF switch based on a PCM material is typically based on two states that this material is likely to assume:
- a high-resistivity amorphous state, which corresponds to an "OFF" state of the switch during which the transmission of an RF signal between at least two terminals is prevented,
- a low-resistivity crystal state, which corresponds to an "ON" state of the switch during which the transmission of the RF signal between both terminals is allowed.

Since both states are stable, it is not necessary to maintain a current/voltage to maintain a state which allows power savings in comparison with other technologies such as switches based on a FET or a PIN diode.

Additionally, a switch provided with a PCM material enables signals with a higher power than that of signals usually conveyed by MEMS switches to be routed.

Document US 2014/0266517 A1, discloses an example of a switch provided with a PCM material inserted between an input conductive line and an output conductive line through which an RF signal is intended to pass.

The phase change of the PCM material is achieved by passing a current pulse in dedicated control electrodes.

A particular example of a structure of a PCM switch is illustrated in FIG. 1.

The RF switch is provided with a region 5 based on the PCM likely to alternately assume a high-resistivity amorphous state, which is assimilated to an OFF state in which a transmission of the RF signal is prevented, and a crystal state which is assimilated to an ON state in which an RF signal is likely to be transmitted between two conductive elements 1, 2 disposed on either side of the region 5 of PCM material.

Switching between an OFF state and an ON state is herein ensured by a so-called "direct" heating using a DC control circuit provided with control electrodes 3, 4 disposed on either side and in contact with the region of PCM material 5 to which current pulses are applied.

When the region 5 is in a low-resistive state, the signal RF is transmitted from one conductive element 1 to the other conductive element 2, but part of the RF signal is likely to leak to the DC control circuit.

In the field of switches with MEMS or transistors, it is known to make an RF/DC decoupling by adding a fixed resistor in series on a control line of the switch. But such a solution applied to PCM switches would require to significantly increase the control voltage necessary to switch the region of PCM material.

Document US 2014/0191181°A1 provides an RF switch with a PCM material in which the RF/DC decoupling is implemented using inductors and capacitors. Such a decoupling circuit has the drawback to be bulky.

Thus, the problem of finding a new structure of RF switch with a PCM material which is improved with respect to the above-discussed drawbacks arises.

DISCLOSURE OF THE INVENTION

One purpose of the invention is to make an RF switch based on a PCM material provided with an RF/DC decoupling means with a reduced bulk.

The purpose set out above is achieved by an RF switch able to modify a connection between a first conductive element and a second conductive element, this switch element being adapted to alternately route an RF signal and stop routing an RF signal between the first conductive element and the second conductive element, the RF switch being provided with:
- a first region based on a phase change material disposed between the first conductive element and the second conductive element,
- state control means for said first region of phase change material which are configured to modify by heating the crystal or amorphous state of said phase change material of said first region, the control means being provided with control electrodes arranged on either side of the first region and provided to apply a state control electrical signal for the first region of phase change material,
- the switch being further provided with a first decoupling switch configured to alternately connect a first control electrode and the first region of phase change material when said first decoupling switch is ON and to disconnect the first control electrode and the first region of phase change material when the first decoupling switch is OFF, the decoupling switch comprising a second region of phase change material disposed between said first control electrode and a second control electrode disposed against the first region of phase change material.

The RF switch can be provided with heating means configured to place the first decoupling switch alternately to an ON state and to an OFF state, the heating means being provided with electrodes arranged on either side of said second region of phase change material and provided to apply an activating electrical signal able to modify the crystal or amorphous state of said phase change material of said second region of phase change material.

According to a first possible implementation of the RF switch, the electrodes for applying the activating electrical signal are heating electrodes distinct from said control electrodes.

According to a second possible implementation, the activating electrical signal is conveyed through the first control electrode. The first control electrode then ensures the function of a heating electrode for the second PCM region and of a control electrode for the first PCM region. According to a particular embodiment, the first conductive element is a conductive line able to convey the RF signal from a first point to a second point of an RF circuit, the first region of phase change material forming a controlled shunt. The second conductive element thereby acts as a ground to which the RF signal can be shunted.

According to a third possible implementation, the activating electrical signal is conveyed by the first control electrode and a heating electrode distinct from said first and second control electrodes.

According to a fourth possible implementation, the electrodes able to apply the activating electrical signal are heating electrodes distinct from said first and second control electrodes, the second region of PCM material being disposed between the first control electrode and a second control electrode in contact with the first conductive element.

The RF switch can be provided with a second decoupling switch able to alternately connect and disconnect another control electrode and the first region of phase change material, said second decoupling switch comprising another region of phase change material disposed between said other control electrode and said first region of phase change material.

In this case, the RF switch can be configured to alternately switch from a first state to a second state and reversely and to switch from the first state of the switch to a third state and reversely, and to switch from the third state to a fourth state and reversely, the first state of the switch being such that the first decoupling switch, the second decoupling switch are ON whereas the first conductive element and the second conductive element are connected to each other, the second state of the switch being such that the first decoupling switch, the second decoupling switch are OFF whereas the first conductive element and the second conductive element are connected to each other, the third state of the switch being such that the first decoupling switch, the second decoupling switch are ON whereas the first conductive element and the second conductive element are disconnected from each other, the fourth state of the switch being such that the first decoupling switch, the second decoupling switch are OFF whereas the first conductive element and the second conductive element are disconnected from each other.

Alternatively, the RF switch can be configured to alternately switch from a first state to a second state and reversely and to switch from the first state of the switch to a third state and reversely, the first state of the switch being such that the first decoupling switch, the second decoupling switch are ON whereas the first conductive element and the second conductive element are connected to each other, the second state of the switch being such that the first decoupling switch, the second decoupling switch are OFF whereas the first conductive element and the second conductive element are connected to each other, the third state of the switch being such that the first decoupling switch, the second decoupling switch are OFF whereas the first conductive element and the second conductive element are disconnected from each other.

At least one third decoupling switch can be provided in series with the first decoupling switch, the third decoupling switch comprising a region of phase change material.

According to an advantageous arrangement of the RE switch, the first control electrode includes distinct connections at several points of the first region of PCM material, the first conductive element or the first electrode being provided with a first conductive portion disposed in a first plane parallel to a main plane of the substrate, with a second conductive portion disposed in a second plane parallel to the substrate main plane and distinct from the first plane, and a conductive via connecting the first conductive portion of the second conductive portion, the first control electrode extending between the first conductive element and the second conductive element without contacting the first conductive element or the second conductive element.

According to a possible implementation of the RF switch, the first region of phase change material can be based on a first phase change material whereas the second region of phase change material can be based on a second phase change material different from the first phase change material.

This can promote performing an independent control between the RF switch and the first decoupling switch.

To allow such an independent control, it can also be contemplated to control the state changes of the first region of change material by direct heating with electrodes in direct contact with this first region, whereas the state changes of the second region of change material are controlled by indirect heating, heating electrodes enabling this state change of the second region to be controlled being located remote and isolated from the PCM material of the second region.

To allow an independent control of the regions of PCM material, the respective geometries of these regions can also be adapted.

Thus, according to a possible implementation, the heating means are provided with heating electrodes arranged on either side of said second region of phase change material, the second region of phase change material having between its heating electrodes, a dimension X2 different from another dimension Y3 corresponding to the width of the heating electrodes in contact with the second region of phase change material According to one embodiment, the second region of phase change material has between its heating electrodes a dimension X2 different from a dimension X3 corresponding to the width of the first control electrode and another control electrode in contact with the first region of phase change material.

BRIEF DESCRIPTION OF THE DRAWINGS

The present invention will be better understood upon reading the description of exemplary embodiments given by way of purely indicating and in no way limiting purposes, making reference to the appended drawings in which:

FIGS. 3A-3D are used to illustrate different operating states of an RF switch.

DETAILED DISCLOSURE OF PARTICULAR EMBODIMENTS

Figure 1:
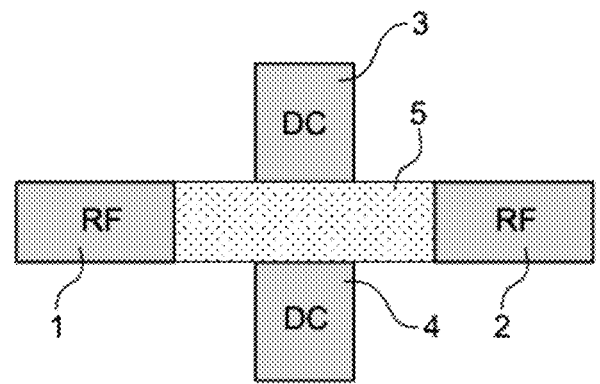
FIG. 1 is used to illustrate an example of an RF switch implemented according to prior art.
Figure 2:
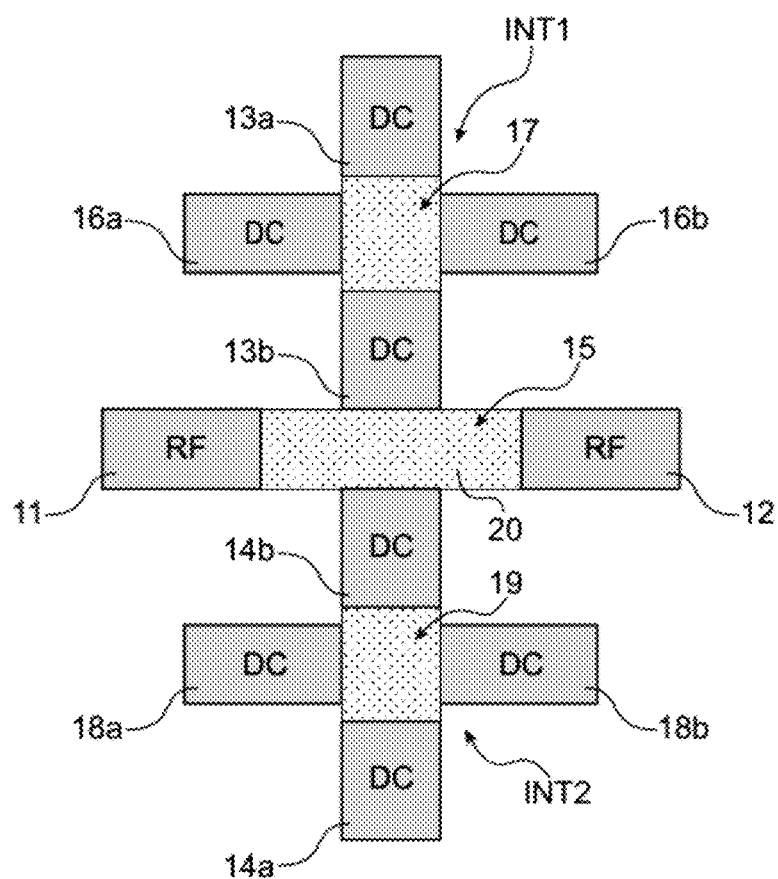
FIG. 2 is used to illustrate an example of an RF switch according to one embodiment of the present invention and provided with DC/RF decoupling switches with a PCM material.

The device of FIG. 2 is first referred to, which schematically illustrates an embodiment of a switch with a phase change material.

This switch enables a connection between at least one first conductive element 11 and at least one second conductive element 12 to be modified. In this example, the conductive elements 11, 12 are elements of a circuit for conveying radio-frequency (RF) signals.

The switch is thus an RF switch able to set up or stop a connection between a first circuit portion and a second circuit portion depending on the state of at least one phase change material (PCM) arranged between both portions. The switch makes it possible to alternately convey an RF signal and prevent conveyance of an RF signal between the conductive elements 11, 12.

The first conductive element 11 and the second conductive element 12 form in this example of embodiment two terminations of an RF electrical signal transmission line, both terminations being separated from each other by a first region 15 based on a phase change material 20 and being electrically connected to, and advantageously in contact with, this phase change material 20.

The switch is likely to assume at least one so-called "ON" state in which the first conductive element 11 and the second conductive element 12 are connected to each other such that at least one RF signal can pass from the first conductive element 11 to the second conductive element 12. The switch is also likely to assume at least one so-called "OFF" state in which, between the first conductive element 11 and the second conductive element 12, the transmission of an RF signal is prevented.

The "ON" and "OFF" states of the switch correspond to different states of the phase change material 20. The phase change material 20 is in particular able to switch from an amorphous state to a crystal state and reversely as a function of the temperature to which it is brought. Thus, this phase change material 20 sandwiched between the conductive elements 11, 12 is likely, when in amorphous form, to assume a strong-resistivity state, and when in crystal form, to assume a low-resistivity state. By "low resistivity", it is meant a resistivity that can be between for example $10^{-4}$ ohm·cm and $10^{-2}$ ohm·cm. By "strong resistivity", it is meant a resistivity which can be between for example 10 ohm·cm to 1 000 ohm·cm.

When the phase change material 20 is in its weakly resistive state (i.e. crystalline), an RF signal can thus be transmitted from the first conductive element 11 to the second conductive element 12 whereas when the phase change material 20 is in its strongly resistive state (i.e. amorphous), the RF signal arriving to the first conductive element 11 is reflected and thereby is not transmitted to the second conductive element 12.

To switch the phase change material 20 from a crystal state to an amorphous state and reversely, the device is provided with state control means for the PCM material 20. This control is here implemented by heating, typically by joule effect, for example by injecting a control electrical current directly in the PCM material 20 of the first region 15.

The state control means of the first region 15 of PCM material are provided with a first control electrode 13a to which the state control electrical signal of the first region 15 of phase change material is intended to be applied. The control signal is typically a DC signal, in particular a current, delivered as direct current pulses.

In this example, the control means are also provided with another control electrode 14a, the first region 15 of phase change material being disposed between the first electrode 13a and this other control electrode 14a.

To switch from a crystal state to an amorphous state, the phase change material 20 is heated to a temperature being in a first range, so as to exceed the melting temperature $T_M$ of the material 20. The temperatures of the first range are high and typically between 600° C. and 1 000° C. The melting temperature $T_M$ is for example in the order of 725° C. for GeTe.

The phase change material 20 is quickly cooled for a duration between about ten and about a hundred nanoseconds such that recrystallisation is avoided and the amorphous state is preserved.

To switch from the amorphous state to the crystal state, the phase change material 20 is then less heated, at a temperature in a second range. The temperatures of the second range are lower than $T_M$. For example, it is heated at a temperature in the order of 150° C. when the material 20 is GeTe. The heating is thereby generally provided for a duration longer than when it is desired to switch the material 20 from the crystal state to the amorphous state. The heating duration that allows reorganisation of the material 20 in its crystal structure can also be provided between one microsecond and about ten milliseconds.

The current pulse enabling to be made amorphous can have an intensity between several hundreds of micro-amperes and several tens of milli-amperes and depends on the amount of PCM material. For example, pulses in the order of 1 mA with a duration in the order of 10 μs can be provided to perform crystallisation, whereas to perform amorphisation, current pulses have a higher intensity, for example in the order of 10 mA and a shorter duration, for example in the order of 50 ns.

To prevent an unintentional transmission of part of the RF signal to the control electrode(s) 13a and/or 14a when the phase change material 20 of the first region 15 is in its low-resistivity crystal state, the device has the feature of not being provided with decoupling means.

These decoupling means are in the example of FIG. 2 in the form of decoupling switches INT1, INT2 disposed on either side of the first region 15. The decoupling switches INT1, INT2 enable the electrodes 13a and 14a respectively of the first region 15 of PCM material to be alternately coupled and decoupled. A controlled decoupling between a DC part and an RF part of the RF switch is thus implemented.

A first decoupling switch INT1 is thus provided for, when it is brought to the ON state, coupling the control electrode 13a and the first region 15 of phase change material. The DC control electrical signal can then be transmitted from the electrode 13a to the first region 15 of phase change material.

The first decoupling switch INT1 is also adapted for, when brought to the OFF state, decoupling said control electrode 13a and the first region 15 of phase change material. The transmission of signals between electrode 13a and region 15, and in particular part of the signal RF from the first region 15 of PCM material are thereby prevented from being directed to the electrode 13a.

The first decoupling switch INT1 is itself formed by a second region 17 of phase change material disposed between the control electrode 13a of the first region 15 of phase change material of the RF switch 11-20-12.

In this particular example of configuration, the decoupling switch INT1 is also provided with a second control electrode 13b disposed against a face of the second region 17 of PCM material opposite to another face against which the first electrode 13a is arranged. The second region 17 of PCM material of the decoupling switch is thus sandwiched between the first control electrode 13a and this second control electrode 13b.

The state changes (from ON to OFF and reversely from OFF to ON) of the decoupling switch INT1 corresponding to the state changes (crystal to amorphous state and reversely amorphous to crystal) of the second region 17 of phase change material are in this example controlled by means of so-called "heating" electrodes 16a, 16b arranged on either side of the second region 17 of phase change material and distinct from the control electrodes 13a, 13b.

To heat the PCM material of the second region 17 of the decoupling switch INT1 and make it change state, a direct heating can be provided, wherein the heating electrodes 16a, 16b are disposed in contact with the PCM material of the second region 17. Heating is typically achieved by joule effect, by injecting an electrical activating signal, for example in the form of a current in the PCM material of the second region 17. The activating signal is typically a DC signal, in particular a current, delivered as direct current pulses.

When an appropriate current pulse passes between both electrodes 16a and 16b through the PCM material of the second region 17, this material switches from a crystal state to a strongly resistive amorphous state. The passage of a signal is thereby blocked between electrode 13b and electrode 13a. To switch the PCM material from its amorphous state to its crystal state, another appropriate current pulse is applied between both electrodes 16a, 16b through the second region 17 of PCM material.

The current pulse enabling the PCM material of the second region 17 to be made amorphous can have an intensity between several hundreds of micro-amperes and several tens of milli-amperes depending on the amount of PCM material. It can be for example contemplated to have pulses in the order of 1 mA and a duration in the order of 10 µs to perform crystallisation, whereas to achieve amorphisation, current pulses have a higher intensity, for example in the order of 10 mA and a shorter duration, for example in the order of 50 ns.

A second decoupling switch INT2 is also provided to alternately couple and decouple a second control electrode 14a for the control means and the first region 15 of phase change material. The second decoupling switch INT2 is also adapted for, when in the OFF state, decoupling the other control electrode 14a from the first region 15 of phase change material. Part of the signal RF is thus prevented from being transmitted to the other control electrode 14a when the first region 15 of phase change material is in a low-resistivity state.

The second decoupling switch INT2 is itself provided with a third region 19 of phase change material about which the other control electrode 14a, a control electrode 14b, a heating electrode 18a, and another heating electrode 18 are distributed.

Alternately switching from the OFF state to the ON state and from ON to OFF the decoupling switch INT2 is controlled by the heating electrodes 18a, 18b disposed against opposite faces of the third region 19 of PCM material.

In this exemplary embodiment, the control electrodes 14a, 14b are located against opposite faces of the third region 19 of PCM material which are different from faces against which the heating electrodes 18a, 18b are arranged. In this configuration, the control electrodes 14a, 14b are distinct from the heating electrodes 18a, 18b and are not in contact with the same.

Thus, in the example of the device just described, the decoupling switches INT1, INT2 are equivalent to bistable variable resistors having advantageously a similar structure to that of the RF switch.

Different operating states of a device as previously described are illustrated in FIGS. 3A-3D.

In a first state illustrated in FIG. 3A, the regions 15, 17, 19 of PCM material are each in a low-resistivity crystal phase. Part of an RF signal for passing through the region 15 of PCM material is thereby likely to leak to the electrodes 13a and 14a.

An activating current is injected between the electrodes 16a and 16b and between the electrodes 18a and 18b to switch respectively the second and third regions 17 and 19 of PCM material to a strongly resistive amorphous phase. Thereby, the device is in a second state as illustrated in FIG. 3B. The regions 17 and 19 of PCM material being in strongly resistive amorphous phases, a leak of part of the RF signal to the control electrodes 13a and 14a is avoided. This state corresponds to the desired ON state of the RF switch.

Then, it is attempted to block the transmission of the RF signal between the first conductive element 11 and the second conductive element 12. For this, the state of the first region 15 of PCM material is modified by injecting a control current between the control electrodes 13a and 14a.

To allow this control current to flow, the second region 17 and third region 19 of PCM material are first brought to a low-resistivity state. For this, an activating current is injected between the heating electrodes 16a and 16b and between the heating electrodes 18a and 18b in order to switch the second region 17 and third region 19 of PCM material in a crystal phase respectively. A state as previously described and illustrated in FIG. 3A is thus again present.

From this first state, another control current is injected between the control electrodes 13a and 14a, so as to switch the first region 15 of PCM material in a strongly resistive amorphous phase without modifying the state of the regions 17 and 19 of PCM material. The transmission of an RF signal is thereby blocked between the first conductive element 11 and the second conductive element 12. This blocked (OFF) state of the RF switch is illustrated in FIG. 3C.

From this state, another activating current can be injected between the electrodes 16a and 16b and between the electrodes 18a and 18b to switch the regions 17 and 19 of PCM material in a strongly resistive amorphous phase respectively. A state as illustrated in FIG. 3D is again present, in which each of the regions 15, 17, 19 is in a strongly resistive amorphous phase.

Then, an activating current can be injected between the electrodes 16a and 16b and between the electrodes 18a and 18b to switch the regions 17 and 19 of PCM material in a low-resistive crystal phase respectively and to return to a state as illustrated in FIG. 3C before injecting an activating electrical signal between the electrodes 13a and 14a, without a dissipation in the regions of PCM material 17 and 19, to switch the first region 15 of PCM material to a low-resistivity crystal phase and thus being again in a state as illustrated in FIG. 3A.

To make it possible to modify the state of the central region 15 and in particular to bring to the amorphous state without modifying the crystal state of one of the regions 17 or 19 or even none of the regions 17, 19, these regions 17, 19 can be provided based on a PCM material different from that of the central region 15. Controlling the regions 17, 19 can also be provided by indirect heating, in other words without a direct contact of the electrodes 16a, 16b, 18a, 18b with the PCM material of the regions 17, 19, wherein the electrodes can be in contact with an intermediate resistive material. Thus, the central region 15 can be based on a first PCM material such as GeTe able to be controlled by direct heating, that is with a direct contact of the electrodes on the PCM material and the regions 17 and 19 based on a second PCM material different from the first material, such as VO₂ the amorphous or crystal state of which is able to be controlled by indirect heating. Both materials have also different transition temperatures.

A current which flows between the electrode 16a and the electrode 16b through an intermediate resistive material placed above a region 17 of VO₂ is likely to produce heat release which, by joule effect, enables the material of this region 17 of VO₂ to be heated above its transition temperature to make it conductive.

The current between the electrodes 16a and 16b is maintained to preserve the conductive state of the material of the region 17.

A power outage between the electrodes 16a and 16b is likely to make the material of the region 17 insulating. The flow of the control current from the central region 15 through the material of the region 17 when it is conductive does not modify its state.

An exemplary operation of such a configuration will now be described. For example, first, there is an initial state as illustrated in FIG. 3B.

A current is then applied between the electrodes 16a, 16b and between the electrodes 18a, 18b such that VO₂ is warmed and becomes conductive. Then, there is a state as illustrated in FIG. 3A.

The current is maintained between electrodes 16a, 16b and between electrodes 18a, 18b and a current is applied between the electrodes 13a and 14a so as to keep the material VO₂ of the regions 17, 19 conductive and make the material GeTe of the central region 15 amorphous. Then, there is a state as illustrated in FIG. 3C.

Power is then shut down between the electrodes 16a, 16b and between the electrodes 18a, 18b so as to make the material VO₂ of the regions 17, 19 insulating and to switch to a state as illustrated in FIG. 3D. Then, a current is again applied between the electrodes 16a, 16b and 18a, 18b which warms the material VO₂ of the regions 17, 19 and makes them conductive. Then, there is a state as illustrated in FIG. 3C.

If a current is maintained between the electrodes 16a, 16b and between the electrodes 18a, 18b and if a so-called "crystallisation" current is applied between the electrodes 13a and 14a, the material VO₂ of the regions 17, 19 remains conductive whereas the material GeTe of the regions 15 becomes crystalline. Then, there is again a state as illustrated in FIG. 3A.

If power is shut down between the electrodes 16a, 16b and between the electrodes 18a, 18b, the material VO₂ of the regions 17, 19 thereby becomes again insulating and there is again a state as illustrated in FIG. 3B.

Alternatively, another configuration can be provided with regions 15, 17 and 19 based on a same PCM material, for example GeTe. In this case, adapted respective geometries and/or dimensions can then be provided for the regions 15, 17 and/or 19 in order to be capable of performing independent switching of the RF switch and the decoupling switch (es).

An exemplary operation of this other configuration is the following one: from a first state as illustrated in FIG. 3A, an amorphisation current is applied between the heating electrodes 16a and 16b and between the heating electrodes 18a, 18b. For example, the amorphisation current applied is in the order of 10 mA for a duration of 50 ns. The regions 17 and 19 thereby become amorphous. If the regions 17 and 19 are controlled by indirect heating, then no current passes through the region 15 and the PCM material of this region 15 remains crystalline. In the case of a direct heating of the regions 17 and 19, the configuration of the circuit can be provided such that this current will be sufficiently low, in particular much lower than 10 mA, not to modify the state of the region 15 and such that the PCM material thereof remains crystalline. The state which has become amorphous of the PCM material of the regions 17, 19 is illustrated in FIG. 3B. When a crystallisation current is now applied between the heating electrodes 16a, 16b and a crystallisation current between the heating electrodes 18a, 18b, the regions 17 and 19 become again in a crystal state. The region 15 thereby remains in turn in a crystal form. Thus, there is again the state illustrated in FIG. 3A.

If an amorphisation current is now applied between the control electrodes 13a and 14a for example in the order of 10 mA for a duration in the order of 50 ns, the current passes through the regions 17, 15 and 19 and the region 15 is made amorphous. The intensity of the amorphisation current is typically proportional to the width of the PCM material through which the current passes. If the regions 17 and 19 are provided with a dimension measured between the electrodes 13a, 13b and between the electrodes 14a, 14b larger than a dimension of the region 15 measured between the electrodes 13b, 14b, then the current to make the region 15 amorphous is higher than to make the regions 17 and 19 amorphous. Thus, there can be a switching of the region 15 to the amorphous state whereas the regions 17, 19 are maintained in a crystal state. Then, there is a state as illustrated in FIG. 3C.

From this state, an amorphisation current can be applied between the heating electrodes 16a, 16b and between the heating electrodes 18a, 18b such that the regions 17 and 19 become amorphous. Then, there is the state illustrated in FIG. 3D. From this state, if a crystallisation current is applied between the heating electrodes 16a and 16b and between the heating electrodes 18a, 18b, the regions 17 and 19 become again in a crystal state and the state illustrated in FIG. 3C is again present.

From this state, if a crystallisation current of 1 mA for a duration of 10 μs is applied between the control electrodes 13a and 14a, then this current passes through the regions 17, 15 and 19 and the region 15 becomes again in a crystal state, whereas the regions 17 and 19 remain in a crystal state. Then, there is again the state illustrated in FIG. 3A.

Another implementation provides to be capable of directly switching from a state as illustrated in FIG. 3A to a state as illustrated in FIG. 3D (switching symbolised by a double dotted line arrow). This is the case if dimensions of the regions 17, 19 respectively measured between the electrodes 13a, 13b and 14a, 14b are this time provided less large than a dimension of the region 15 measured between the electrodes 13b, 14b. This is also the case if an amorphisation current sufficiently significant in terms of intensity and duration to make the regions 17, 15, 19 amorphous is provided. For example, if the regions 17 and 19 have a width of 1 μm and that a current in the order of 10 mA is necessary to make them amorphous and if the region 15 is of a width of 2 μm, a current of 20 mA can be provided to directly switch from the state of FIG. 3A to that of FIG. 3D.

Likewise, a state as illustrated in FIG. 3D can be directly switched also to a state illustrated in FIG. 3A.

A switch as previously described can be made in thin films on a substrate.

Figure 4A:
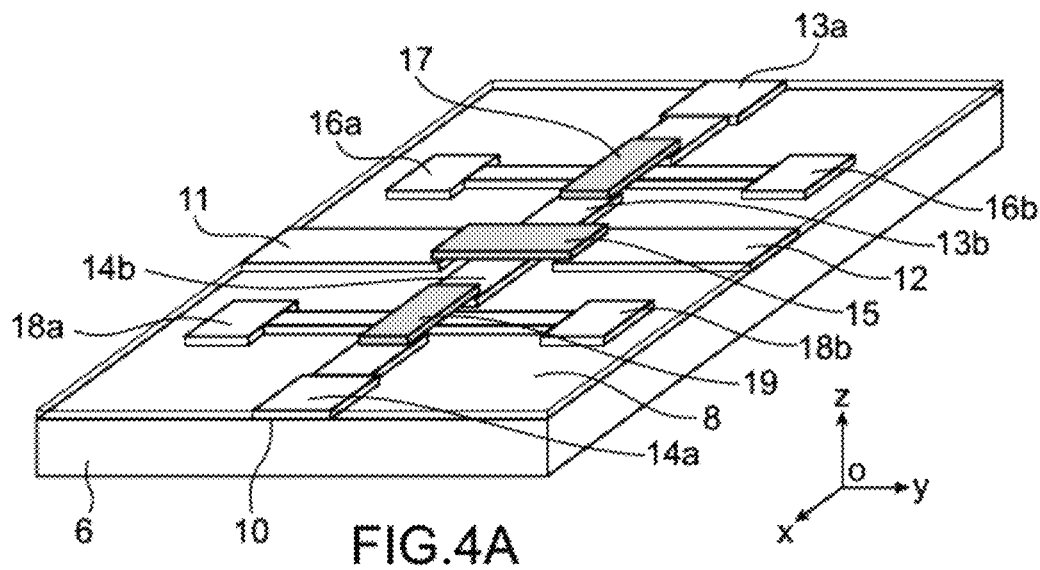
FIGS. 4A-4C are used to illustrate an example of an embodiment of the RF switch on a substrate.
Figure 4B:
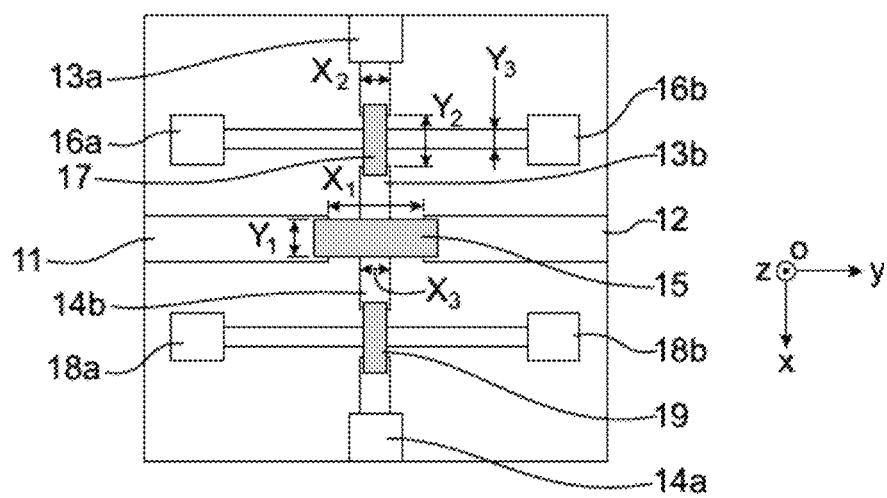
Figure 4C:
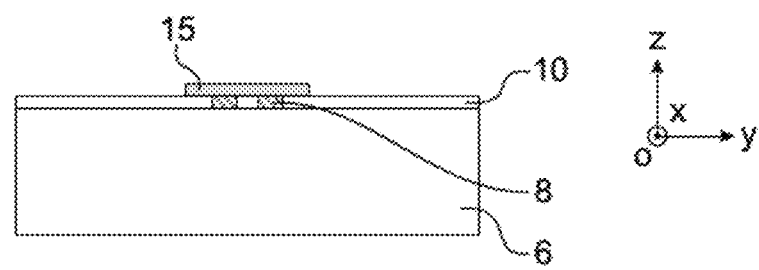

FIGS. 4A-4C illustrate (through respectively a perspective view, a top view, and a transverse cross-section view) an example of an integration of an RF switch with a PCM material and an RF/DC decoupling system on a substrate 6 which can be semi-conductive and for example of silicon.

The switch can be disposed on an insulating layer 8 for passivating the substrate 6 or an insulating layer 8 for example of the IMD ("Intermetal Dielectric Layer") type and which is located between two interconnection levels of electronic components or an insulating layer belonging to one of the final levels commonly called "back-end" levels of an integrated circuit.

The conductive elements 11, 12, and electrodes 13a, 13b, 14a, 14b, 16a, 16b and 18a, 18b are formed for example from a conductive layer 10 which can be, for example, based on a pure metal such as aluminium (Al), copper (Cu), gold (Au), titanium (Ti), silver (Ag) or tungsten (W) or a metal alloy such as AlCu, or AlSi. Other conductive materials such as for example doped semi-conductors, in particular doped silicon, metal oxides such as ruthenium oxide ($RuO_2$), iridium oxide ($IrO_2$) can also be used. Advantageously, the conductive elements 11, 12, and control electrodes 13a, 13b, 14a, 14b are based on a transparent conductive material such as for example the conductive oxide ITO ("Indium tin oxide") or a conductive polymer such as PEDOT (3,4-ethylenedioxythiophene). The deposition of the conductive layer is made for example by a PVD ("Physical Vapour Deposition") method. Several stacked conductive materials can be used to form the conductive elements and electrodes.

In the example of FIGS. 4A-4C, the conductive elements and electrodes are based on a same conductive material. Alternatively, the conductive elements can be made using a conductive material different from that (those) used to make the heating and control electrodes.

The insulating layer 8 on which the elements 11, 12 and electrodes are disposed can, in turn, be for example based on silicon dioxide $SiO_2$, or SiN, or AlN, or $Al_2O_3$.

The phase change material(s) of the regions 15, 17 and 19 can be based on the chalcogenide or an alloy of chalcogenides such as $Ge_2Sb_2Te_5$ or GeTe. GeTe makes it possible for example to achieve a resistance modulation from $10^4$ to $10^6$ subsequent to a quick controlled warming of the material. This modification is due to a quick and reversible change between a highly resistive phase (for which the conductivity is typically in the order of 10 S/m to 1 S/m for the amorphous phase of GeTe) and a low-resistivity phase (where the conductivity is typically in the order of 100 kS/m to 1 MS/m for the crystal phase of GeTe). As in the exemplary embodiments previously described, the regions 15, 17, 19 can be based on a same PCM material or be formed by different PCM materials.

The dimensions of the first region 15 of PCM material are typically provided so as to have a resistance in the ON state in the order of 1 Ohm in order to allow a proper transmission of the RF signal. For example, for this, a parallelepiped-shape GeTe region 15 with a length X1 for example in the order of 1 μm between the conductive elements 11 and 12, a width Y1 for example in the order of 30 μm between the electrodes 13b, 14b and a thickness for example in the order of 100 nm can be provided for a material with a conductivity of 300 kS/m.

The dimensions of the regions 17 and 19 are defined depending on the desired resistance values. When these regions 17, 19 are of GeTe, a variable resistance from 30 ohms to 1 Mega-ohm can for example be achieved by providing these regions as parallelepiped bands with a length of 1 μm, a width of 1 μm and a thickness of 100 nm. Thus, decoupling switches with small dimensions can advantageously be made.

The regions 15, 17 and 19 of PCM material can be provided with dimensions such that a transverse cross-section of a volume of PCM material of the second region 17 separating the heating electrodes 16a, 16b (or the third region 19 separating the heating electrodes 18a, 18b) is lower than a transverse cross-section of a volume of the first region 15 of PCM material separating the control electrodes 13b, 14b. The transverse cross-section is measured in parallel to the axis z of an orthogonal reference frame [0; x; y; z] defined in FIGS. 4A-4C.

In the example illustrated in FIG. 4B, regions 17, 19 with a dimension X2 between the heating elements-electrodes 16a, 16b (resp. 18a, 18b) higher than another dimension Y3 corresponding to the width of the heating electrodes 16a, 16b (resp. 18a, 18b) in contact with the region 17 (resp. 19) can be provided. With such a geometry, a phase change of a region 17 can be achieved when a first current between the heating electrodes 16a, 16b passes through this region 17 without a current with a same intensity between the control electrodes 13a, 13b necessarily generating a corresponding phase change in the region 17. In this example, the dimension X2 of the region 17 measured between the control electrodes 13a, 13b is also provided higher than that X3 corresponding to the width of the electrodes 13b, 14b in contact with the region 15. This assists in setting up an independent control between decoupling switches and RF switch.

Thus, the energy necessary to change phase of the regions 17, 19 will be lower than to change phase of the first region 15. The regions 17, 19 are provided in terms of composition and dimensions so as to have a sufficiently low resistance not to oppose to current flow at the time of changing the phase of the first region of PCM material 15 and a sufficiently high resistance in the OFF state for example in the order of 1 MΩ to allow an efficient BF/RF decoupling.

An exemplary process for manufacturing an RF switch with a DC/RF decoupling system will now be given in connection with FIGS. 5A-5H.

The starting support of this process is a substrate 6, for example of silicon covered with an insulating layer 8 for example of $SiO_2$ (silicon dioxide) and with a thickness which can be for example in the order of 500 nm.

On this insulating layer 8, a conductive layer 10 in which patterns are made for example by photolithography and etching is first deposited. This conductive layer 10 is typically formed by a stack of several conductive materials, for example a Ti-based layer with a thickness in the order of 10 nm, a TiN-based layer with a thickness in the order of 40 nm, a layer of AlCu with a thickness in the order of 440 nm, a Ti layer with a thickness in the order of 10 nm and a TiN-based layer with a thickness in the order of 100 nm. The deposition can be performed by a PVD technique. The structuration of the conductive layer 10 is made so as to define partly the patterns of the conductive elements 11, 12, the control electrodes 13a, 13b, 14a, 14b, the heating electrodes 16a, 16b, 18a, 18b.

Figure 5A:
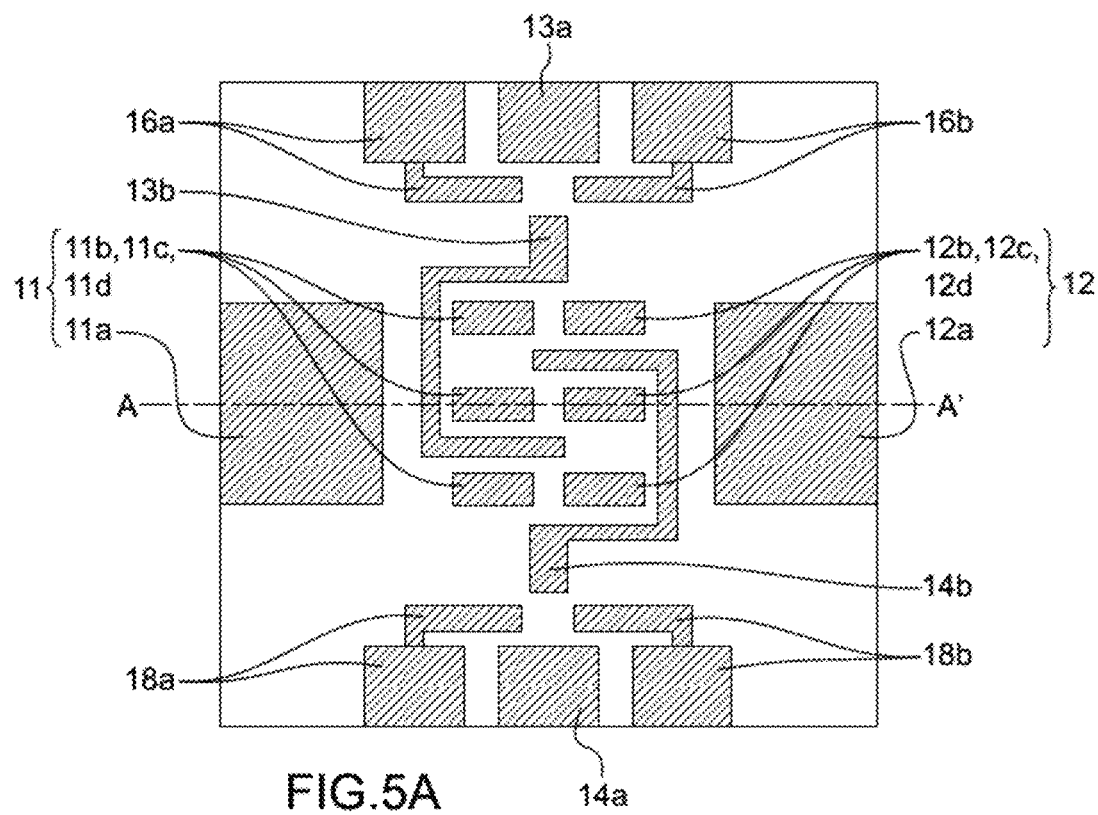
FIGS. 5A-5H are used to illustrate an example of a process for manufacturing an RF switch with a DC/RF decoupling switch.
Figure 5B:
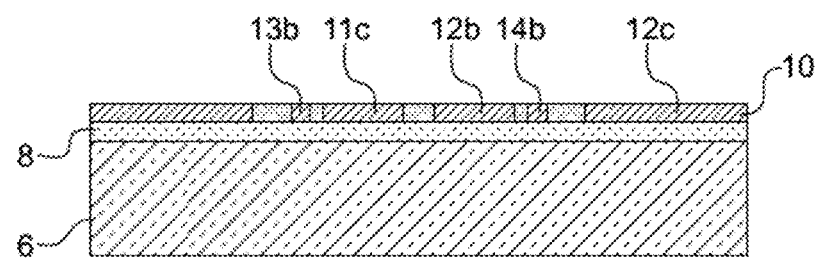

In the particular example illustrated in FIGS. 5A-5B (giving respectively a top view and a transverse cross-section view along an axis AA'), the conductive elements 11, 12 between which the RF signal is intended to pass therethrough are formed by several disjointed conductive portions 11a, 11b, 11c, 11d, 12a, 12b, 12c, 12d. The conductive elements 11, 12 can be in particular formed by main portions 11a, 12a in the form of pads occupying a given area (measured in parallel to the main plane of the substrate) and several secondary portions 11b, 11c, 11d, 12b, 12c, 12d, in the form of parallel conductive bands disposed between the pads 11a, 12a and with a size in terms of area occupied on the substrate which is lower than that of the pads.

The control electrodes 13b, 14b extend in this example between the conductive elements 11, 12.

A deposition of insulating material for example of $SiO_2$ with a thickness for example in the order of 700 nm is then made using for example an HDPCVD ("High Density Plasma Chemical Vapour Deposition") type plasma. Then, for example by CMP ("Chemical mechanical polishing"), a planarisation is performed so as to reach and reveal the upper face of the conductive portions.

Then, a phase change material 20, such as GeTe for example with a thickness in the order of 100 nm, is deposited for example by PVD. Then, patterns are made in this material 20 so as to form the first region 15 of PCM material for the RF switch and the second and third regions 17, 19 of PCM material for the decoupling switches. The patterns of PCM material 20 are typically structured by photolithography and etching, for example of IBE ("Ion Beam Etching") type.

Figure 5C:
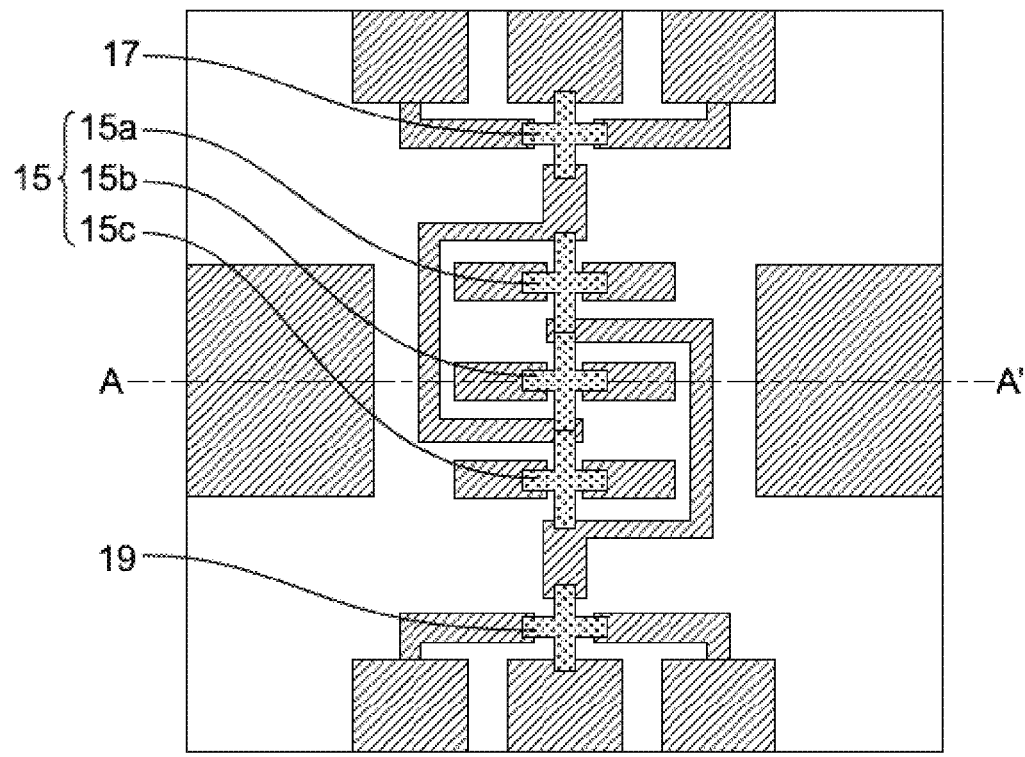
Figure 5D:
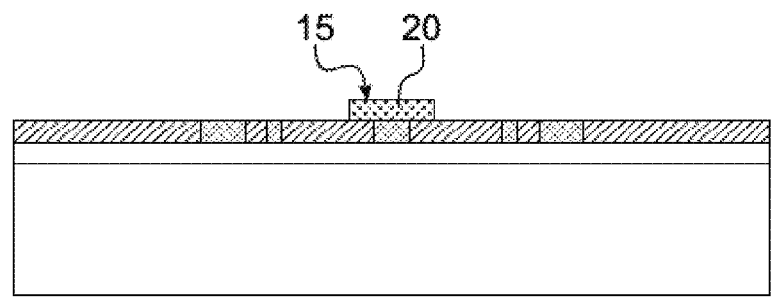
Figure 5E:
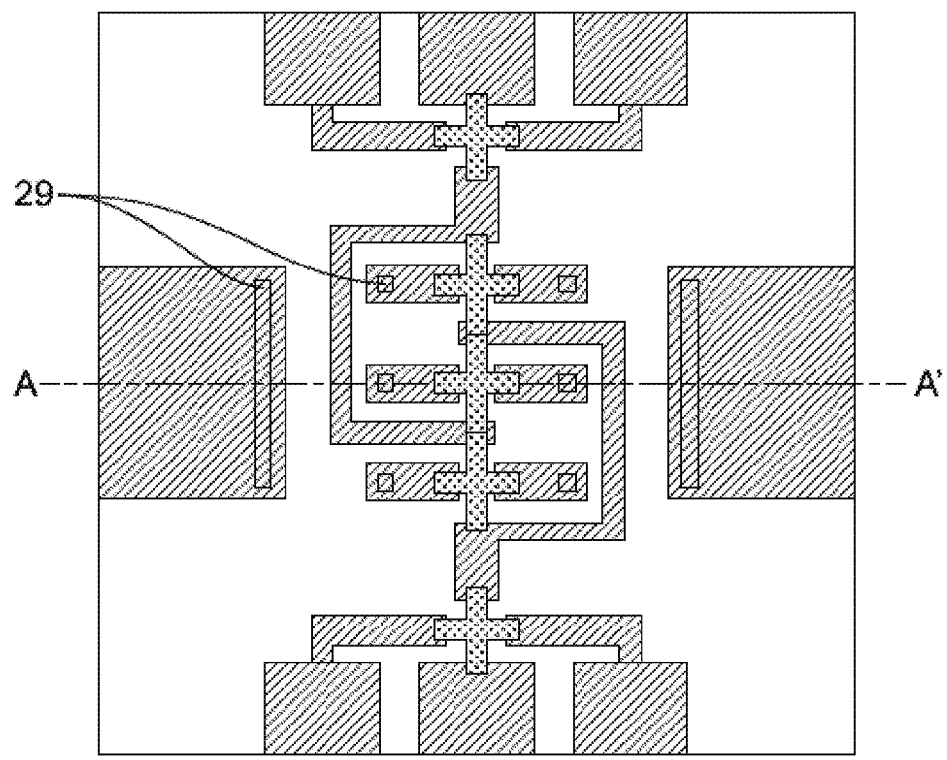
Figure 5F:
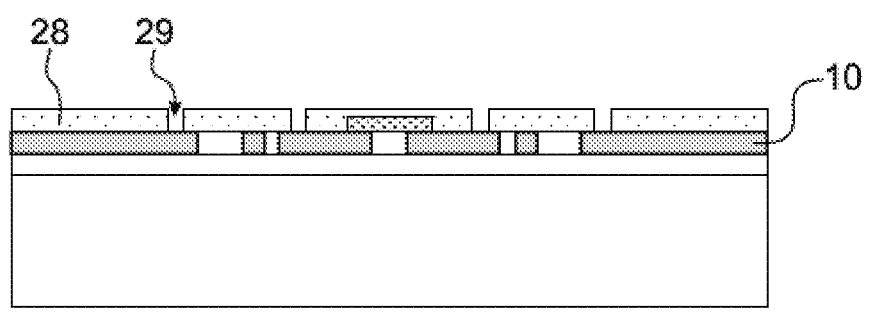

In the exemplary embodiment illustrated in FIGS. 5C-5D, the first region 15 of PCM material is structured as plots 15a, 15b, 15c each aligned as a cross the ends of the branches of which rest on the conductive portions of the conductive elements 11, 12 and of the control electrodes 13b, 14b.

The regions 17, 19 of PCM material make cross-shaped patterns the ends of the branches of which rest on conductive portions of heating electrodes and control electrodes.

The phase change material 20 is then passivated by depositing a dielectric material 28 such as SiN with a thickness for example in the order of 100 nm and which can be formed using a PECVD ("Plasma Enhanced Chemical Vapour deposition") technique.

Vertical connection elements also called "vias" 41 are then formed in this dielectric material 28. For this, as illustrated for example in FIGS. 5E-5F, apertures 29 are first made for example by photolithography and etching. A reactive ion etching (RIE) can in particular be used. The apertures 29 reveal zones contacting portions of the conductive layer 10 in which conductive elements and electrodes are formed.

A second conductive level 60 is then deposited, for example by PVD, in order to complete the formation of the conductive elements 11 and 12. The second conductive level 60 can be formed by a stack comprising for example a Ti layer in the order of 10 nm, a TiN layer which can be in the order of 40 nm, an AlCu layer for example in the order of 900 nm, a Ti layer for example in the order of 10 nm and a TiN layer for example in the order of 40 nm.

Then, conductive portions 61, 62 are made in this second conductive level which is then structured by photolithography and etching. These conductive portions 61, 62 are respectively connected to the conductive portions 11a, 11b, 11c, 11d, and to the conductive portions 12a, 12b, 12c, 12d of the first conductive level through the vias 41.

Figure 5G:
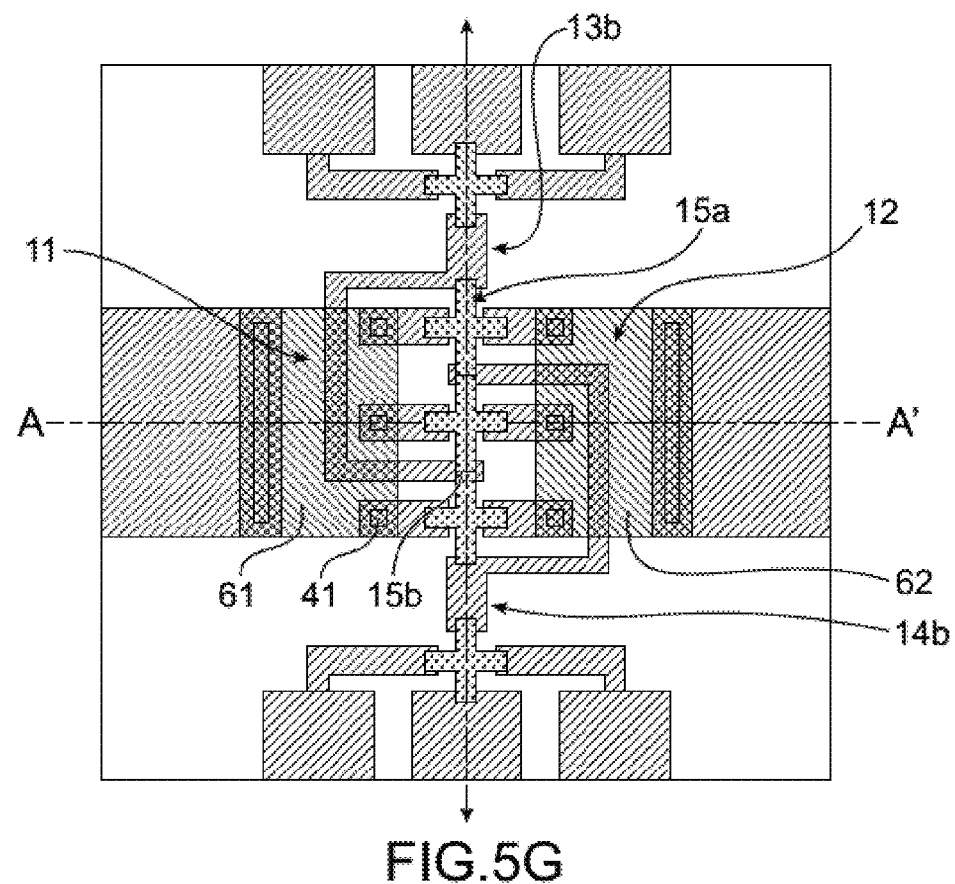
Figure 5H:
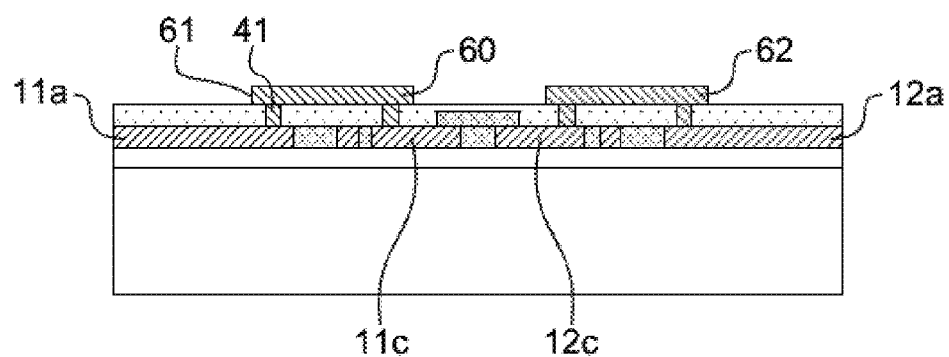

A distribution of the conductive elements 11, 12 into conductive portions disposed on several conductive levels enables an arrangement as illustrated in FIGS. 5G-5H to be made in which portions of a control electrode 13b pass facing zones of a conductive element 11 of the second conductive level.

Such an arrangement enables a control electrode 13b to be connected to several points of the first region of PCM material 15. The control electrodes 13b, 14b can in particular be connected to the first region 15 of PCM material at several distinct points in a zone which is located between the conductive elements 11, 12, without contacting these conductive elements 11, 12.

In this zone, the first region 15 of PCM material is alternately connected to a conductive portion of a conductive element 11 or 12 and to a conductive portion of the control electrode 13b or 14b.

A connection of the control electrodes 13b, 14b at several distinct points 15a, 15b of the first region 15 of PCM material distributed along the same can allow a better control of the amorphous and crystal states of this first region 15.

Alternatively to the arrangement just described, it can be provided to make control electrodes on several levels with at least one conductive portion disposed in a first plane parallel to a main plane of the substrate, a second conductive portion disposed in a second plane parallel to the main plane of the substrate and distinct from the first plane, and a conductive via connecting the first conductive portion and the second conductive portion, in order to be capable of passing the control electrode between the RF conductive elements 11, 12 and making a connection at several points of the first region 15 of PCM material.

In the exemplary process just described, the PCM material of the regions 15, 17, 19 is located between two conductive levels 10, 60 in which the conductive elements 11, 12 are formed.

Figure 6:
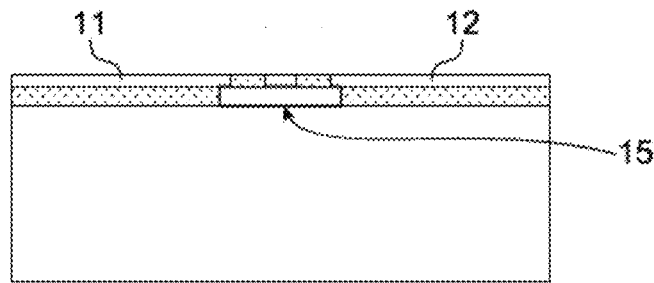
FIG. 6 is used to illustrate an alternative embodiment of an RF switch made on a substrate and provided with regions of phase change material disposed under control and/or heating electrodes.

Another distribution of the PCM material and of the conductive levels is possible. Thus, according to another exemplary configuration illustrated in FIG. 6, regions 15, 17, 19 of PCM material are disposed under the conductive levels 10, 62 in which the conductive elements 11, 12, the control electrodes 13a, 14a, 13b, 14b, and heating electrodes are formed. To form such a device, the PCM material is typically deposited before making the metal level(s) of the electrodes. A first advantage is that the PCM material can be deposited in a first clean room type environment fulfilling some contamination rules peculiar to the BEOL ("Back-end of line") type processes of microelectronics and that metal levels can then be made in another environment, for example amenable to noble metal deposition. Another advantage of such a configuration is that some PCM materials can require annealings at high temperatures typically higher than 600° C. after the deposition step, whereas such temperatures can turn out to be too high for some metals.

As has been previously seen, the state of the first region 15 of PCM material can be modulated by direct heating, that is with a warming obtained by passing a current applied through electrodes 13b, 14b directly disposed in contact with the PCM material.

It is also possible to implement a phase or state change of the regions 15, 17, 19 by indirect heating by virtue of thermal radiations/conduction produced by an offset heat source which is not in contact with the phase change material.

Figure 7A:
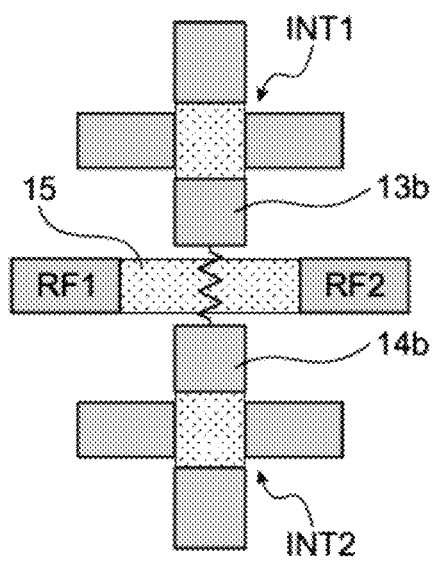
FIGS. 7A-7C are used to illustrate alternative embodiments for which control electrodes of an RF switch and/or heating electrodes of a decoupling switch are arranged so as to perform indirect heating of the regions of phase change material with which they are associated.

Such a type of indirect heating is illustrated for example in FIG. 7A. The RF switch is in this example provided with control electrodes 13b, 14b located on either side of the first region 15 of PCM material but this time remote from the same, without being in contact with this first region 15. A separating space between region 15 and electrodes 13a, 13b can be provided in the order of several tens of nm, for example of 100 nm. This space can be occupied by an electrically insulating material and preferably thermally conducting material such as for example SiN or AlN.

Figure 7B:
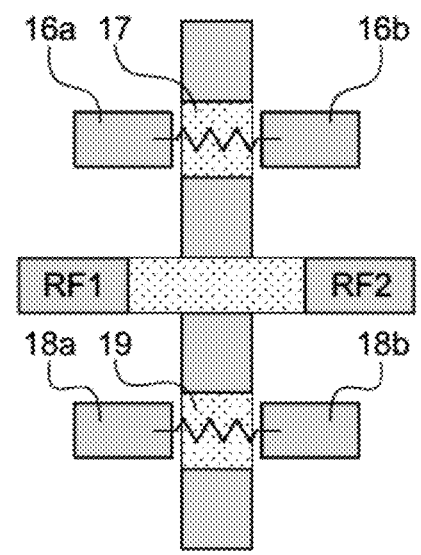

An alternative illustrated in FIG. 7B provides this time to control the state change of the decoupling switches INT1, INT2 by indirect heating. The heating electrodes 16a, 16b, 18a, 18b that enable the resistivity of the regions 17, 19 of PCM material of the decoupling switches to be modulated are thus located remote from these regions 17, 19.

Figure 7C:
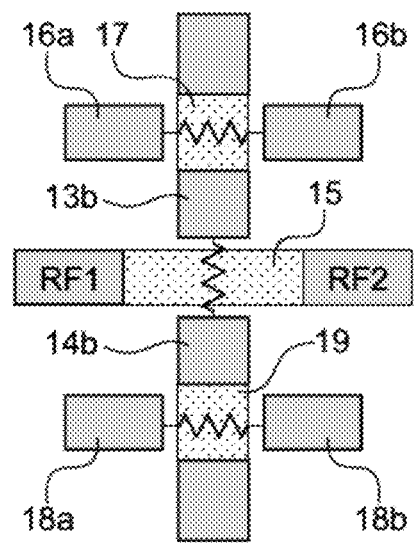

In the RF switch illustrated in FIG. 7C, these are both the regions 17, 19 of the decoupling switches and the central region 15 of PCM material the state of which is controlled by indirect heating. The heating electrodes 16a, 16b, 18a, 18b and the control electrodes 13b, 14b are not disposed in contact with the PCM material the state of which they enable to be controlled.

In either of the examples of the RF switch just described, the control electrodes 13a, 13b, 14a, 14b enabling the resistivity of the first region 15 of PCM material to be modulated and the heating electrodes 16a, 16b, 18a, 18b enabling the resistivity of the regions 17, 19 of PCM material to be modulated are distinct. According to another possible implementation of the switch, it is provided to ensure the modulation of the state of the region of the RF switch and of a DC/RF decoupling switch associated through a same pair of electrodes.

Figure 8:
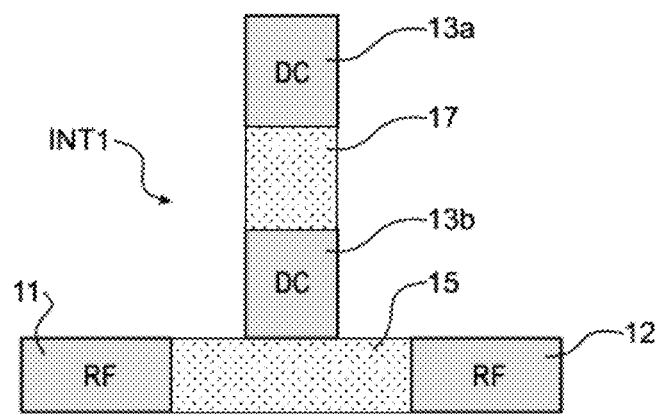
FIG. 8 is used to illustrate an example of an RF switch formed by an RF switch associated with a DC/RF decoupling switch with a PCM material the state of which is controlled using electrodes also used to control the state of the PCM material of the RF switch.

In FIG. 8, an alternative with a single decoupling switch INT1 connected to the region 15 of PCM material is provided. In order to further reduce the bulk of the RF switch, it is also possible to reduce the number of electrodes associated with the decoupling switch INT1. Instead of foreseeing to use specific heating electrodes, it is provided in this example to apply electrical activating signals enabling the state of the region 17 of PCM material of the decoupling switch to be modulated, respectively to a control electrode 13a and to a control electrode 13b.

To modify the resistivity state of the second region 17 of PCM material, a control electrical signal is applied between the control electrodes 13a, 13b.

To modify the resistivity state of the first region 15 of PCM material, an activating electrical signal is applied between a control electrode 13a and a conductive element 11 or 12.

Figure 9:
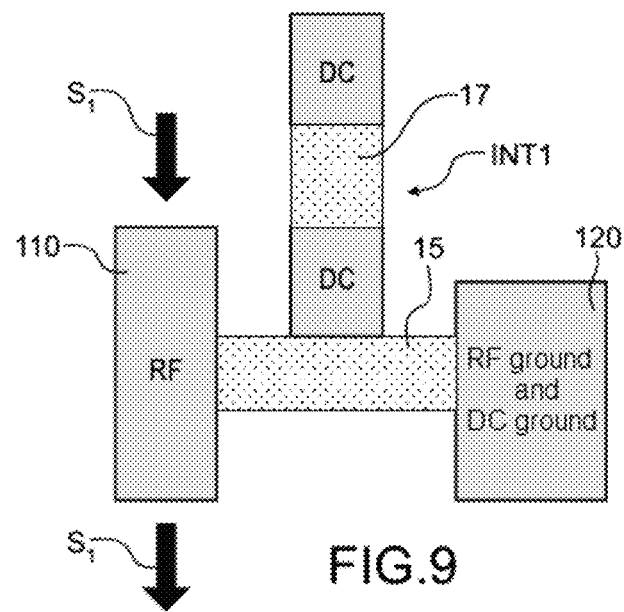
FIG. 9 is used to illustrate an RF switch formed by a line routing an RF signal alternately connected to, and disconnecting from a shunt depending on the state of a region of PCM material itself associated with a decoupling switch.

Such a configuration can be used to form a controllable shunt as illustrated in FIG. 9.

An RF signal $S_1$ is routed by a first conductive element in the form of a conductive line 110 to which is a region 15 of PCM material is connected, itself connected to a decoupling switch INT1.

A signal $S_1$ flows in the conductive line 110 when the first region 15 of PCM material is in its strongly resistive state. When the first region 15 is in its low-resistivity state, a short-circuit is created such that the signal $S_1$ is thereby transmitted to a second conductive element acting as a ground 120 both for the RF part and for the DC part of the device and in particular for the state control means of the first PCM region 15.

Alternatively to the examples previously illustrated, at least one decoupling switch having an electrode fulfilling both the control electrode and heating electrode function can be provided. The electrode is thus able to route a state control signal from the first region of PCM material and an activating signal enabling the state of the PCM material of this decoupling switch to be modified.

Figure 10:
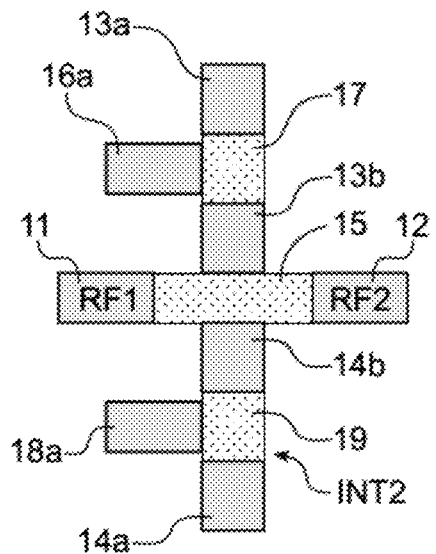
FIG. 10 is used to illustrate an RF switch provided with a decoupling switch the state of which is controlled through a heating electrode and a control electrode also used to control the state of an RF switch.

In the exemplary embodiment illustrated in FIG. 10, to modify the state of a region 17 of PCM material of a first decoupling switch INT1, an activating signal is applied between an electrode 13a both used as control and heating electrodes, and an electrode 16a used as a heating electrode. When a phase change of a region 19 of PCM material of a second decoupling switch INT2 is desired, an activating signal is applied between a control electrode 14a also operating as a heating electrode, and another heating electrode 18a. The electrodes 13a, 13b, 14a, 14b are provided to convey a control signal enabling the state of the region 15 of PCM material of the RF switch to be modified.

It can be provided to associate the RF switch to one or more decoupling switches based on a PCM material 200 different from the PCM material 20 disposed between the conductive elements 11, 12 of the RF switch. In particular, when the PCM material 200 has a transition temperature different from that of the PCM material 20, this promotes independent control of the RF switch and decoupling switches.

Figure 11:
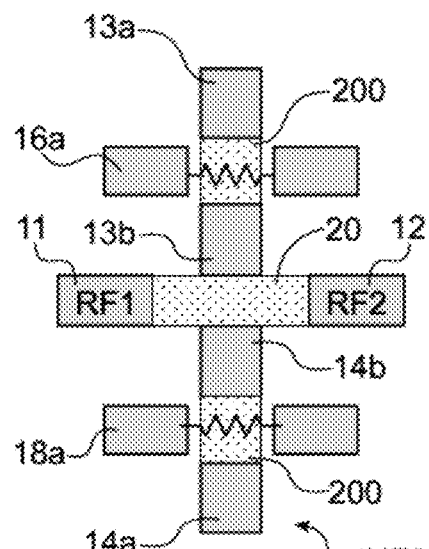
FIG. 11 is used to illustrate an RF switch provided with an RF switch and a DC/RF decoupling switch, these switches including regions based on different PCM materials.

In an exemplary embodiment illustrated in FIG. 11, the RF switch is provided with a region 15 based on a first PCM material 20 such as for example GeTe or $Ge_2Sb_2Te_5$. The switched resistances or decoupling switches INT1, INT2 are this time made using another phase change material 200, for example $VO_2$. At room temperature, such a material is in the insulating state, whereas at a temperature in the order of 68° C., $VO_2$ undergoes an abrupt and reversible transformation of its electric properties and becomes conductive. When it is desired to switch the first region 15 of PCM material, a current can be flown between the heating electrodes 16a and 16b and between the heating electrodes 18a and 18b. By Joule effect, the resistances between the heating electrodes 16a, 16b and 18a, 18b will warm. The thermal radiations produced then enable the temperature of their PCM material 200, here based on $VO_2$, to be raised above its transition temperature.

Thereby, a control current can be flown through the electrodes 13a, 14a to modify the state, in other words the phase in which the first PCM material is.

The activating current can then be shut down in the resistances between the heating electrodes 16a and 16b and between 18a and 18b, in order to cause a state or phase change of the second PCM material 200. The second material 200, herein VO$_2$ then returns below its transition temperature and will provide insulation between the RF switch part and the DC control.

The decoupling level can be increased between the RF switch part and the DC control part of the RF switch with a PCM material by increasing the number of decoupling switches and by placing one or more further decoupling switch(es) in series with the decoupling switch(es) based on a PCM material.

Figure 12:
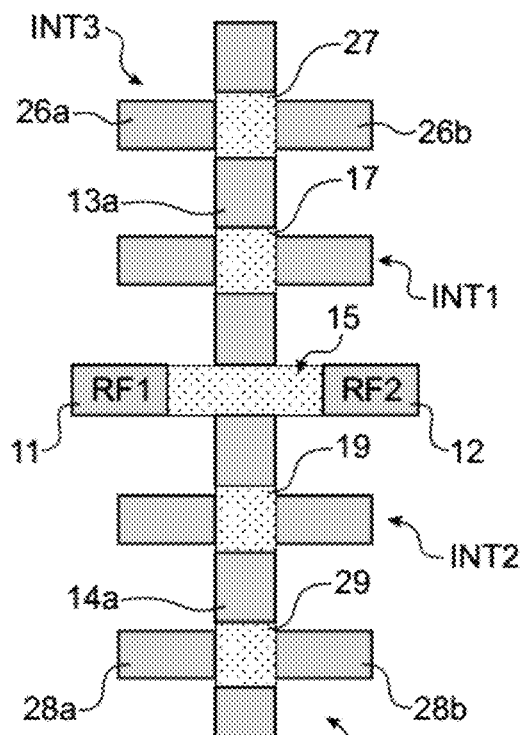
FIG. 12 is used to illustrate an RF switch with several decoupling switches in series.

In the exemplary embodiment of FIG. 12, further switches INT3 and INT4 are disposed in series with the first decoupling switch INT1 and the second decoupling switch INT2 respectively.

The further switches INT3 and INT4 are provided with regions 27, 29 of phase change material respectively the state of which is controlled using heating electrodes 26a, 26b, 28a, 28b.

According to an alternative embodiment of the RF switch with PCM material, it can be provided to apply the DC control signals of the state of the first region 15 of PCM material through conductive elements 11, 12 through which the RF signal is intended to pass.

Figure 13:
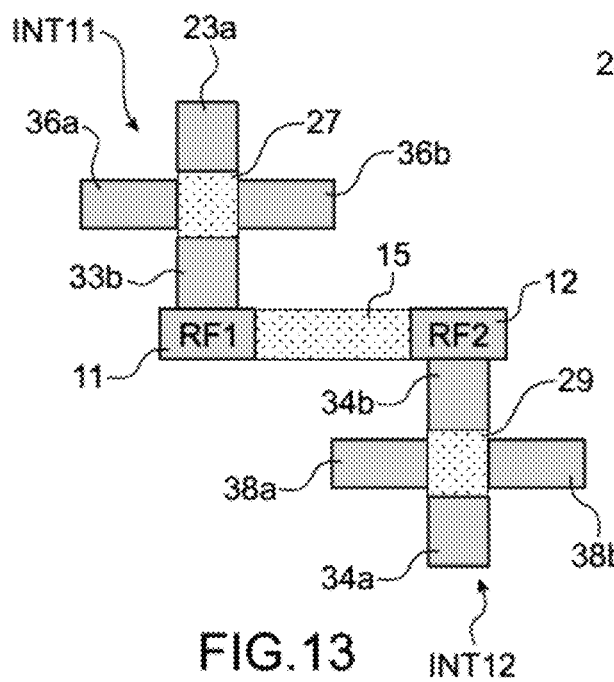
FIG. 13 is used to illustrate an RF switch with a decoupling switch in series with an RF switch.

FIG. 13 illustrates an exemplary embodiment of such an alternative with INT11 and INT12 switches each formed by a pair of control electrodes 33a, 33b (respectively 34a, 34b) disposed on either side of a region 27 (resp. 29) of PCM material the crystal/amorphous state of which is controlled by means of heating electrodes 36a, 36b (resp. 38a, 38b).

The control DC signals of the state of the first region 15 of PCM material are conveyed through electrodes 33b, 34b of the switches INT11 and INT12 in contact with the first conductive element 11 and the second conductive element 12 respectively.

Figure 14:
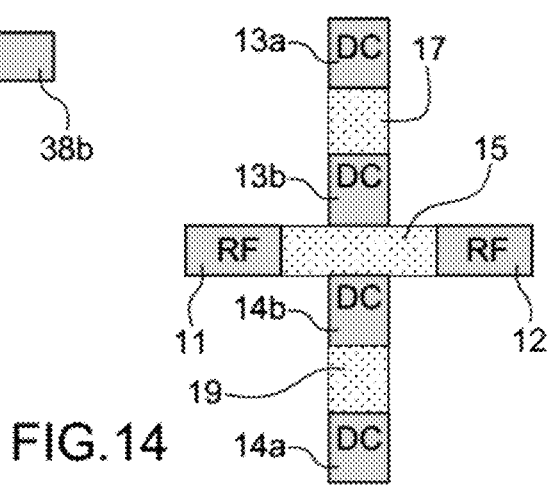
FIG. 14 is used to illustrate an alternative RF switch with decoupling switches without a further heating electrode.

FIG. 14 illustrates another exemplary embodiment, without heating electrodes on either side of the regions 17, 19 of phase change material of the decoupling switches. The control electrodes 13a, 13b, 14a, 14b play in this case both the role of controlling the state, whether amorphous or crystal of the PCM material of the region 15 forming the RF switch and also of controlling the state, whether amorphous or crystal, of the regions 17, 19 of the decoupling switches. Such a device can thus directly switch from a state as illustrated in FIG. 3A, in which the RF switch and the decoupling switches are closed (ON) to a state as illustrated in FIG. 3D where the RF switch and decoupling switches are opened (OFF), and reversely from the state illustrated in FIG. 3D to the state illustrated in FIG. 3A.

The invention claimed is:

1. An RF switch configured to modify a connection between a first conductive element and a second conductive element, said RF switch being configured to alternately route an RF signal and stop routing the RF signal between the first conductive element and the second conductive element, the RF switch comprising: a first region of phase change material disposed between the first conductive element and the second conductive element, a control device with control electrodes arranged on either side of said first region and configured to apply a state control electrical signal for the first region of phase change material, the control device being configured to modify a state of said first region of phase change material by heating said phase change material of said first region, said phase change material being in a crystal state or in an amorphous state, a first decoupling switch configured to alternately connect a first control electrode and said first region when said first decoupling switch is ON and to disconnect the first control electrode and said first region when the first decoupling switch is OFF, the first decoupling switch comprising a second region of phase change material disposed between the first control electrode and a second control electrode, said second electrode being arranged against said first region of phase change material.

2. The RF switch according to claim 1, wherein the RF switch is provided with a heating device configured to place the first decoupling switch alternately to an ON state and to an OFF state, the heating device being provided with electrodes arranged on either side of said second region of phase change material and provided to apply an activating electrical signal configured to modify the crystal state or amorphous state of said phase change material of said second region of phase change material.

3. The RF switch according to claim 2, wherein said electrodes configured to apply the activating electrical signal to the first decoupling switch are heating electrodes distinct from the first control electrode and from said second control electrode.

4. The RF switch according to claim 2, wherein the activating electrical signal is applied through the first control electrode.

5. The RF switch according to claim 4, wherein the first conductive element is a conductive line able to convey the RF signal from a first point to a second point of an RF circuit, the first region of phase change material forming a shunt and the second conductive element forming a ground to which the RF signal is transmitted when the phase change material of said first region is brought to a crystal state.

6. The RF switch according to claim 2, wherein the activating electrical signal is conveyed by the first control electrode and a heating electrode distinct from said control electrodes.

7. The RF switch according to claim 6, further comprising a second decoupling switch adapted to alternately connect and disconnect another control electrode and the first region of phase change material, said second decoupling switch includes another region of phase change material disposed between said other control electrode and said first region of phase change material.

8. The RF switch according to claim 7, configured to alternately switch from a first state to a second state and reversely and to switch from the first state of the RF switch to a third state and reversely, and to switch from the third state to a fourth state and reversely, the first state of the RF switch being such that the first decoupling switch, the second decoupling switch are ON whereas the first conductive element and the second conductive element are connected to each other, the second state of the RF switch being such that the first decoupling switch, the second decoupling switch are OFF whereas the first conductive element and the second conductive element are connected to each other, the third state of the RF switch being such that the first decoupling switch, the second decoupling switch are ON whereas the first conductive element and the second conductive element are disconnected from each other, the fourth state of the RF switch being such that the first decoupling switch, the second decoupling switch are OFF whereas the first conductive element and the second conductive element are disconnected from each other.

9. The RF switch according to claim 7, configured to alternately switch from a first state to a second state and reversely and to switch from the first state of the switch to a third state and reversely,
the first state of the RF switch being such that the first decoupling switch, the second decoupling switch are ON whereas the first conductive element and the second conductive element are connected to each other,
the second state of the RF switch being such that the first decoupling switch, the second decoupling switch are OFF whereas the first conductive element and the second conductive element are connected to each other,
the third state of the RF switch being such that the first decoupling switch, the second decoupling switch are OFF whereas the first conductive element and the second conductive element are disconnected from each other.

10. The switch according to claim 7, further comprising at least one third decoupling switch in series with the first decoupling switch, the third decoupling switch comprising a region of phase change material.

11. The RF switch according to claim 2, wherein the heating device is an indirect heating device provided with heating electrodes arranged on either side of said second region of phase change material and remote from said second region of phase change material.

12. The RF switch according to claim 2, wherein the heating device is provided with heating electrodes arranged on either side of said second region of phase change material, the second region of phase change material having between its heating electrodes a dimension X2 different from another dimension Y3 corresponding to a width of the heating electrodes in contact with the second region of phase change material.

13. The RF switch according to claim 12, and wherein the second region of phase change material has between its heating electrodes the dimension X2 different from the dimension X3 corresponding to the width of the first control electrode and of another control electrode in contact with the first region of phase change material.

14. The RF switch according to claim 1, wherein the first region of phase change material is made of a first phase change material, the second region of phase change material being made of a second phase change material different from the first phase change material.

15. The RF switch according to claim 1, the RF switch being arranged on a substrate, the first control electrode including distinct connections at several points of the first region of PCM material, the first conductive element or the first control electrode being provided with:
a first conductive portion disposed in a first plane,
a second conductive portion disposed between a second plane parallel and distinct from the first plane, and
a conductive via connecting the first conductive portion of the second conductive portion, the first control electrode extending between the first conductive element and the second conductive element without contacting the first conductive element or the second conductive element.

* * * * *